(12) United States Patent
Bessho

(10) Patent No.: US 8,413,523 B2
(45) Date of Patent: Apr. 9, 2013

(54) OSCILLATION CIRCUIT

(75) Inventor: Daisuke Bessho, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/132,556

(22) PCT Filed: Dec. 16, 2009

(86) PCT No.: PCT/JP2009/006908
§ 371 (c)(1),
(2), (4) Date: Jun. 2, 2011

(87) PCT Pub. No.: WO2010/070892
PCT Pub. Date: Jun. 24, 2010

(65) Prior Publication Data
US 2011/0226067 A1    Sep. 22, 2011

(30) Foreign Application Priority Data

Dec. 18, 2008  (JP) .................. 2008-322155

(51) Int. Cl.
*G01F 1/66* (2006.01)
(52) U.S. Cl. ................................. 73/861.27
(58) Field of Classification Search .......... 73/861.27, 73/861.26, 861.25
See application file for complete search history.

(56) References Cited

U.S. PATENT DOCUMENTS

| | | | |
|---|---|---|---|
| 4,584,676 A * | 4/1986 | Newman ............... | 367/108 |
| 5,874,941 A * | 2/1999 | Yamada ............... | 345/157 |
| 6,819,195 B1 | 11/2004 | Blanchard et al. | |
| 7,987,731 B2 | 8/2011 | Bessyo et al. | |
| 2010/0319464 A1 | 12/2010 | Bessyo et al. | |

FOREIGN PATENT DOCUMENTS

| EP | 2101160 A1 | 9/2009 |
|---|---|---|
| JP | 63-113309 U | 7/1988 |
| JP | 63-187412 U | 11/1988 |
| JP | 64-004102 A | 1/1989 |
| JP | 05-075343 A | 3/1993 |
| JP | 09-270639 A | 10/1997 |
| JP | 11-284438 A | 10/1999 |
| JP | 11-298247 A | 10/1999 |
| JP | 2002-016437 A | 1/2002 |
| JP | 2003-032039 A | 1/2003 |
| WO | WO 2008-081610 A1 | 7/2008 |

OTHER PUBLICATIONS

International Search Report from International Application No. PCT/JP2009/006908, dated Feb. 2, 2010, 1 page.

* cited by examiner

*Primary Examiner* — Jewel V Thompson
(74) *Attorney, Agent, or Firm* — Brinks Hofer Gilson & Lione

(57) ABSTRACT

An oscillation circuit has an oscillator having a resonant frequency, an amplifier connected to the oscillator, an energizing pulse generator for generating a energizing pulse within a certain range including the resonant frequency, a switching unit for switching between connection and disconnection of the energizing pulse generator and the oscillator, and the amplifier, and a motion command unit for sending a command signal to the energizing pulse generator for starting operation, in which the switching unit connects the oscillator and the energizing pulse generator during a cycle, a half cycle, or several cycles of the energizing pulse generated by the energizing pulse generator starting at a time when the motion command unit sends the motion signal.

5 Claims, 3 Drawing Sheets

OSCILLATION CIRCUIT

TECHNICAL FIELD

The present invention relates to an oscillation circuit for shortening the time for driving of an oscillation circuit that uses an oscillator until stable oscillation is reached.

BACKGROUND ART

Generally, power-conservation measures are required of battery operated devices. As an example, battery-operated ultrasonic flow meters are intermittently operated so far as the accuracy of the flow meters permits. Ultrasonic flow meters measure the velocity of a flow based on measurement of propagation time of ultrasonic waves, and calculate the quantity of flow by multiplying the flow rate with the cross-sectional area of the piping. Propagation time of ultrasonic waves is measured by using pulses of a fixed frequency and counting the number of pulses between transmission and reception of the ultrasonic waves, and multiplying the pulse frequency by the number of pulses. When making intermittent flow measurements, it is power-thrifty if these pulses can be stopped when flow rate measurement is stopped. For generating pulses of the fixed frequency to be used for propagation time measurement of ultrasonic waves, an oscillation circuit containing a ceramic oscillator or a crystal oscillator is used.

However, as these oscillators require some time after start of operation until generation of stable pulses, it is necessary to start the oscillation circuit in advance before starting flow rate measurement. Here, such start of the oscillation circuit is referred to as "cold start" for convenience' sake. The longer the period of cold start is, the more power conservation is disturbed.

Accordingly, there was proposed a method to advance stable operation of oscillation circuits by using an oscillation circuit and a ring oscillator, in which pulses adjusted to the oscillation frequency of the oscillator are generated by the ring oscillator, and stable operation of the oscillation circuit is advanced by giving these pulses to the basic oscillation circuit for a certain period of time from an early period of the start (ref. Patent Literature 1, for example). Here, the oscillation circuit comprises a crystal oscillator, a capacitor to insure reliability of oscillation, a resistor, and an amplifier. The ring oscillator has a current source having temperature correction capability.

A switching circuit lies between the basic oscillation circuit and the ring oscillator.

This method of advancing start of the oscillation circuit by giving a pulse to the oscillation circuit from outside at an early stage of start of the oscillation circuit is called "hot start" for convenience.

Though this is an effective method for advancing start of the oscillation circuit, it suffers a problem of calling for a ring oscillator having a power source with temperature-correction function, thus resulting in complicated circuit configuration.

There also was an ultrasonic flow meter that intermittently operated, for the purpose of reducing electric power consumption, a oscillator for making pulses for measuring transmission time of ultrasonic waves, and was equipped with oscillation initiation means for advancing vibration of the oscillator (ref. Patent Literature 2, for example). In Patent Literature 2, it is described that the method described in Patent Literature 1 is effective for intermittent operation of pulses to be used for measurement of transmission time of ultrasonic waves.

However, in the above configuration, as the start of the oscillation circuit is advanced in an early stage of the start of the oscillation circuit by giving a pulse from outside to the oscillation circuit, a current source having temperature correction function such as a ring oscillator is required thus resulting in a complicated circuit construction.

[Patent literature 1] U.S. Pat. No. 6,819,195
[Patent literature 2] International Publication No. 2008/081,610

SUMMARY OF THE INVENTION

The oscillation circuit of the present invention includes a oscillator having a resonant frequency, an amplifier connected to the oscillator, an energizing pulse generator for generating a energizing pulse of a frequency within a certain range including the resonant frequency, a switching unit for switching between connection and disconnection the energizing pulse generator and the oscillator, and the amplifier, and a motion command unit for sending a command signal to the energizing pulse generator for starting operation, where the switching unit connects the oscillator and the energizing pulse generator during a cycle, a half cycle, or plural cycles of the energizing pulse generated by the energizing pulse generator starting at a time when the motion command unit sends the motion signal.

With the oscillation circuit of such a structure, although the energizing pulse generator generates energizing pulses having a resonant frequency close to that of the oscillator, as the allowable frequency range of the energizing pulse becomes wide, hot start can be realized with a very simple circuit structure without calling for temperature correction function.

DETAILED DESCRIPTION OF THE PREFERRED EMBODIMENTS

Referring to drawings, preferred embodiments of the present invention will be described in the following.

Embodiment

Figure 1:
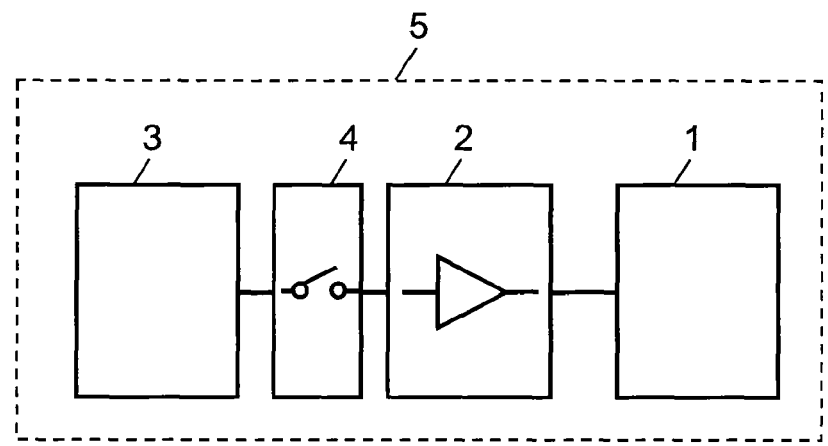
FIG. 1 is a block diagram of the oscillation circuit in an embodiment of the present invention.

FIG. 1 is a block diagram of the oscillation circuit in a preferred embodiment of the present invention. In FIG. 1, oscillation circuit 5 includes oscillator 1, amplifier 2, energizing pulse generator 3 for generating energizing pulses, and switching unit 4. Here, switching unit 4 switches between connection and disconnection of energizing pulse generator 3, oscillator 1 and energizing pulse generator 3, and amplifier 2. Also, oscillation circuit 5 includes an operation command unit not shown in FIG. 1, and the operation command unit issues a command signal for start of operation to oscillator 1, amplifier 2, energizing pulse generator 3, and switching unit 4. The operation command unit is composed of a microcomputer.

As oscillator 1, a crystal oscillator or a ceramic oscillator, or a crystal oscillator or a ceramic oscillator added with a capacitor to stabilize their action is used. As the acuity of resonance of impedance characteristic of ceramic oscillators is mild compared with crystal oscillators, it is more adequate to the present invention than crystal oscillators. For any of the oscillators, the pulses obtained by vibrating at their resonant frequency are used for various applications.

Figure 2:
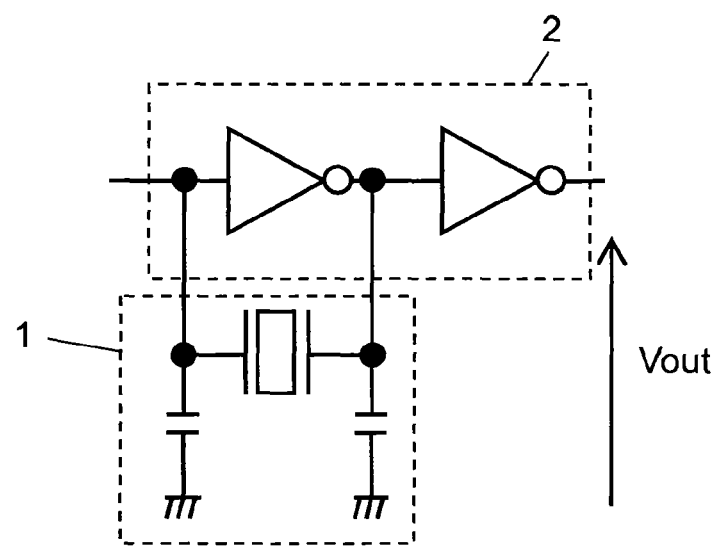
FIG. 2 is a circuit diagram of the oscillator and an amplifier of the oscillation circuit.

FIG. 2 is a circuit diagram of an oscillator of the oscillation circuit and an amplifier in an embodiment of the present invention. FIG. 2 is a circuit diagram showing oscillator 1 and amplifier 2 of oscillation circuit 5 shown in FIG. 1. As ceramic oscillator 1, a 4 MHz ceramic oscillator in RBRC-G series made by Kyocera Corporation is used, for example, and TC74HCU series and TC74HC series amplifiers made by Toshiba Semiconductor Company are used as the amplifier.

Figure 3:
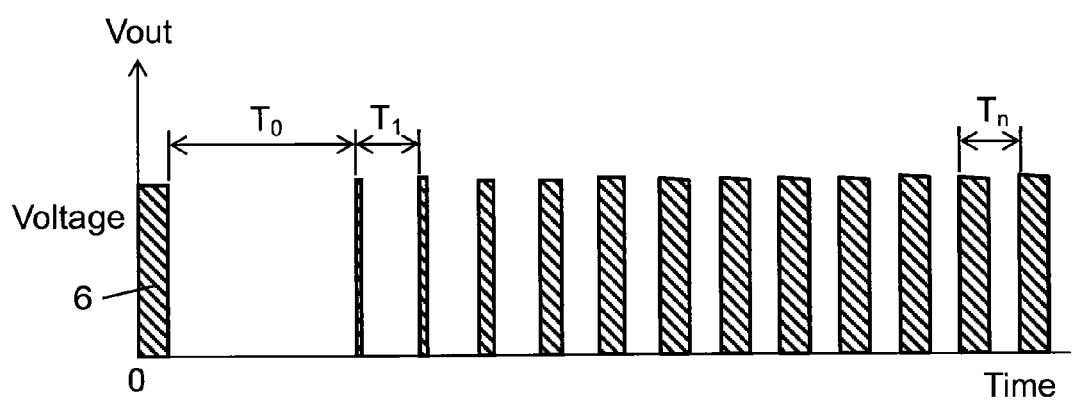
FIG. 3 is a voltage waveform of output pulse Vout of the oscillation circuit.

FIG. 3 is a voltage waveform of output pulse Vout of the oscillation circuit in an embodiment of the present invention. FIG. 3 shows waveform of the output pulse Vout obtained by using oscillation circuit 5 shown in FIG. 1 and FIG. 2. In FIG. 3, time 0 (starting point) is the time at which a command signal to start motion is dispatched by motion command unit (not shown) to amplifier 2 which is on standby by with electric power being supplied in advance. Also, at time 0 (base point), an energizing pulse is supplied from energizing pulse generator unit 3 to oscillator 1 and amplifier 2. Energizing pulse 6 is supplied by energizing pulse generator unit 3 and has a width of a half cycle of a frequency close to the resonant frequency (4 MHz) of oscillator 1 in the case of FIG. 3.

When oscillator 1 is energized by energizing pulse generator unit 3, vibration starts to take place, the amplitude of vibration gradually increases, and self-oscillation pulses due to oscillator 1 and amplifier 2 are produced after time T0. As shown in FIG. 3, though periodicity is nearly constant (4 MHz) in the early stage, the duty (the ratio between high time and low time) is low and gradually approaches 50%. When seemingly constant cycles are measured with a measuring instrument (timing interval analyzer), it is known to be changing as shown in FIG. 4 in which periodic changes of output pulse Vout of the oscillation circuit in an embodiment of the present invention are plotted.

Figure 4:
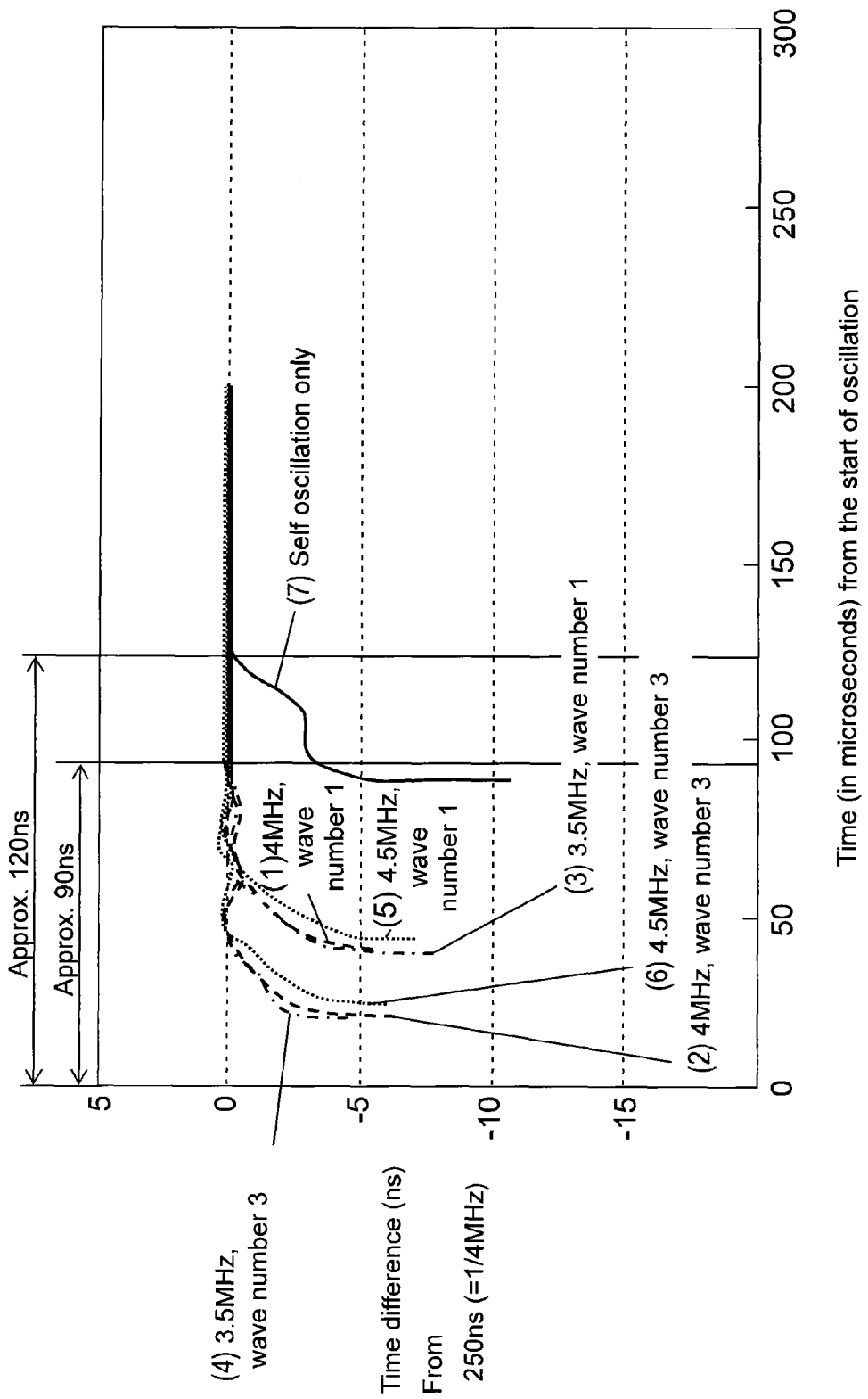
FIG. 4 is a characteristic diagram showing periodic change of output pulse Vout of the oscillation circuit.

In FIG. 4, making the timing at which a command signal for starting motion is issued from the motion command unit (not shown) to amplifier 2 which is on standby as the base point (0), energizing pulses are provided to oscillator 1 and amplifier 2 from energizing pulse generator 3 at such timing. FIG. 4 is a characteristic curve plotting periodic changes of the output pulse Vout of amplifier 2, in which the time difference until the energizing pulses finally stabilize (the period being 250 ns because of use of a 4 Hz oscillator) is plotted in the vertical axis as a function of time from the start of oscillation in the horizontal axis. Different characteristic curves are based on different energizing frequencies and wave numbers of the energizing pulses.

In FIG. 4, "(1) 4 MHz, wave number 1" indicates a case in which wave number 1 (a half cycle) was given at an energizing pulse frequency appropriate to the resonant frequency of oscillator 1, and the cycle of Vout pulse is stable at approximately 90 microseconds.

"(2) 4 MHz, wave number 3" indicates the case in which wave number 3 (2.5 cycles) was given at an energizing pulse frequency appropriate to the resonant frequency of oscillator 1. In this case, though the timing of appearance of Vout pulse output is earlier than case (1), it takes approximately 90 microseconds until the cycle of Vout pulse becomes stable.

"(3) 3.5 MHz, wave number 1" indicates the case in which wave number 1 (half cycle) was given at an energizing pulse frequency shifted from the resonant frequency of oscillator 1, and it takes approximately 90 microseconds until the cycle of Vout pulse becomes stable.

"(4) 3.5 MHz, wave number 3" indicates a case in which wave number 3 (2.5 cycles) was given at an energizing pulse frequency shifted from the resonant frequency of oscillator 1. Though the appearance of output of Vout pulse was earlier than case (3), it takes approximately 90 microseconds until the cycle of V out pulse becomes stable.

"(5) 4.5 MHz, wave number 1" indicates a case in which wave number 1 (half a cycle) was given at an energizing pulse frequency shifted from the resonant frequency of oscillator 1, and it takes approximately 90 microseconds until the cycle of Vout pulse becomes stable.

"(6) 4.5 MHz, wave number 3" indicates a case in which wave number 3 (2.5 cycles) was given at an energizing pulse frequency shifted from the resonant frequency of oscillator 1. Though the appearance of output of Vout pulse is earlier than (5), it takes approximately 90 microseconds until the cycle of Vout pulse becomes stable.

"(7) Self excitation only" is a case in which no energization was given, where the appearance of Vout pulse is the latest, taking approximately 120 microseconds until the cycle stabilizes.

As is clear from the above, in the case energization was done by energizing pulses as above, the time until the pulse frequency of Vout pulse stabilizes was shortened by 30 microseconds compared with the case in which no energization was done. In addition, even when the frequency of the energizing pulses for oscillator 1 having resonance frequency of 4 MHz (ceramic oscillator) was changed in the range 3.5 MHz to 4.5 MHz, the time until stability of the cycle of Vout pulse remained unchanged as 90 microseconds. Also, when the number of waves of the energizing pulses was changed, Vout pulse output appeared faster when the wave number was 3 compared with the case of wave number 1. However, it is known that the time until the cycle of Vout pulses stabilize remains unchanged at 90 microseconds.

For the resonance frequency 4 MHz of oscillator 1, 3.5 MHz and 4.5 MHz are equivalent to −12.5% and +12.5%, respectively, and they represent the allowable frequency range of the energizing pulses. This is the key condition for attaining simple configuration in designing circuit configuration of energizing pulse generator 3 for making energizing pulses that are within the allowable frequency range. When designing a circuit using semiconductor IC's, for example, the 4 MHz oscillator can be a ring oscillator that uses delay of a device, or a CR oscillation circuit based on capacitor C and resistor R. In either case of a ring oscillator or a CR oscillation circuit, such a large allowance as +/−12.5% does not essentially require any consideration on the temperature characteristics or device dispersion of semiconductors, capacitors, and resistors. As a result, temperature correction circuit and frequency adjustment circuit are not required thus allowing realization of energizing pulse generator 3 with simple construction. Especially in the case of CR oscillation circuits, barely no consideration will be needed on variations in resistors and capacitors contained in semiconductor IC's and having large temperature characteristics, thus making it possible to reduce use of outboard components other than semiconductor IC's.

In this way, energizing pulse generator unit 3 sets pulse frequency of energizing pulses using a capacitor and a resistor, or pulse width of the energizing pulses, and generates pulses (energizing pulses) of a frequency within a certain allowable frequency range including the resonant frequency. As a result, energizing pulse generator 3 can be designed with a simple circuit structure.

Also, energizing pulse generator 3 may set the pulse frequency of the energizing pulses or the pulse width of the energizing pulses using a ring oscillator. As a result, the construction of oscillation circuit 5 on a semiconductor device is made easy.

Also, by designing switching unit 4 in such a manner that, in the initial period of driving (during the period of 1 cycle, half a cycle, or several cycles starting at the time an operation command was issued by the operation command unit) of driving the oscillator, the oscillator and the energizing pulse generator unit are connected, hot start can be realized with an extremely simple circuit structure without calling for temperature correction function.

Also, though the ring oscillator contained in a semiconductor IC suffers frequency change due to temperature, the circuit can be made simple without calling for external parts other than semiconductor IC as tolerance is large.

A simple way of shortening the period from the start of driving of an oscillation circuit having an oscillator with the above mentioned resonant frequency until stable oscillation is reached, uses the oscillator intermittently in order to reduce electric power consumption, and is effective as a vibration initiation means for advancing vibration of the oscillator. As a result, it can also be applied to ultrasonic flow meters to be used for measuring propagation time of ultrasonic waves in which pulses for each cycle are intermittently generated.

INDUSTRIAL APPLICABILITY

As described above, according to the oscillation circuit of the present invention, as the start of stable oscillation of an oscillator can be advanced, the oscillation circuit can be used for applications where intermittent operation of an oscillator is required for the purpose of reducing electric power consumption. For example, in an ultrasonic battery-driven flow meter, accurate measurement of flow rate is possible even when using an oscillator for measuring propagation time of ultrasonic waves for intermittent operation.

REFERENCE MARKS IN THE DRAWINGS

1. Oscillator
2. Amplifier
3. Energizing pulse generator
4. Switching unit
5. Oscillation circuit
6. Energizing pulse

The invention claimed is:

1. An oscillation circuit comprising:
   an oscillator having a resonant frequency;
   an amplifier connected to the oscillator;
   an energizing pulse generator for generating a energizing pulse of a frequency within a certain range including the resonant frequency;
   a switching unit for switching between connection and disconnection of the energizing pulse generator and the oscillator, and the amplifier; and
   a motion command unit for sending a command signal to the energizing pulse generator for starting operation,
   wherein the switching unit connects the oscillator and the energizing pulse generator during a cycle, half a cycle or several cycles of the energizing pulse generated by the energizing pulse generator starting at a time when the motion command unit sends the motion signal.

2. The oscillation circuit of claim 1, wherein a ceramic oscillator is used as the oscillator.

3. The oscillation circuit of claim 1,
   wherein the energizing pulse generator sets the pulse frequency of the energizing pulse or a pulse width of the energizing pulse by using a capacitor and a resistor.

4. The oscillation circuit of claim 1,
   wherein the energizing pulse generator sets the pulse frequency of the energizing pulse or the pulse width of the energizing pulse by using a ring oscillator.

5. An ultrasonic flow meter comprising the oscillation circuit of claim 1,
   wherein the pulses obtained from the oscillation circuit are used for measurement of time of transmission of ultrasonic waves.

* * * * *